(12) United States Patent
Nistler et al.

(10) Patent No.: US 7,173,422 B2
(45) Date of Patent: Feb. 6, 2007

(54) GENERATOR FOR GENERATING TIME-VARIABLE MAGNETIC FIELDS AND MAGNETIC RESONANCE DEVICE

(75) Inventors: Jürgen Nistler, Erlangen (DE); Stefan Stocker, Großenseebach (DE); Markus Vester, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 183 days.

(21) Appl. No.: 10/957,434

(22) Filed: Oct. 1, 2004

(65) Prior Publication Data

US 2005/0099180 A1  May 12, 2005

(30) Foreign Application Priority Data

Oct. 1, 2003 (DE) .................. 103 45 766

(51) Int. Cl.
*G01R 33/20* (2006.01)
*G01V 3/00* (2006.01)
*H01F 5/00* (2006.01)

(52) U.S. Cl. ............. 324/318; 324/322; 335/299
(58) Field of Classification Search .......... None
See application file for complete search history.

(56) References Cited

U.S. PATENT DOCUMENTS

| | | | | |
|---|---|---|---|---|
| 4,714,887 A * | 12/1987 | Meissner et al. | ........... | 324/322 |
| 4,725,781 A * | 2/1988 | Roschmann | ............... | 324/318 |
| 4,839,594 A | 6/1989 | Misic et al. | | |
| 5,331,281 A * | 7/1994 | Otsuka | ................ | 324/318 |
| 5,574,372 A * | 11/1996 | Moritz et al. | ............. | 324/318 |
| 6,100,693 A * | 8/2000 | Eberler et al. | ............. | 324/318 |
| 6,531,870 B2 * | 3/2003 | Heid et al. | .................. | 324/318 |
| 6,590,393 B2 * | 7/2003 | Vaughn et al. | ............. | 324/318 |
| 6,798,203 B2 * | 9/2004 | Nistler et al. | ............... | 324/318 |
| 6,842,003 B2 * | 1/2005 | Heid et al. | .................. | 343/318 |
| 6,850,206 B2 * | 2/2005 | Heid et al. | .................. | 343/787 |
| 6,906,520 B2 * | 6/2005 | Heid et al. | .................. | 324/322 |
| 6,930,482 B2 * | 8/2005 | Heid et al. | .................. | 324/318 |
| 7,098,661 B2 * | 8/2006 | Nistler et al. | ............... | 324/318 |
| 2002/0050818 A1 * | 5/2002 | Vaughn et al. | ............. | 324/318 |
| 2002/0105329 A1 * | 8/2002 | Heid et al. | .................. | 324/318 |
| 2002/0145428 A1 * | 10/2002 | Nistler et al. | ............... | 324/318 |

(Continued)

FOREIGN PATENT DOCUMENTS

DE   34 45 724 A1   6/1985

(Continued)

*Primary Examiner*—Diego Gutierrez
*Assistant Examiner*—Tiffany A. Fetzner

(57) ABSTRACT

In one aspect, a generator for generating time-variable magnetic fields is provided. The generator includes a gradient coil having conductors extending in an area defined by a hollow first cylinder, and having no conductors in a central area of the hollow first cylinder, the central area defined by the volume of a second cylinder arranged coaxially with and inside the first cylinder, the second cylinder having a diameter of one third the diameter of the first cylinder. The generator also includes a high frequency shielding device enclosing the central area but not the conductors, a high frequency antenna arranged in the central area; and a coaxial connecting cable operatively connected to the high frequency antenna arranged along a longitudinal axis of the first and second cylinder, the connecting cable penetrating the high frequency shielding device at a plurality of locations.

20 Claims, 2 Drawing Sheets

U.S. PATENT DOCUMENTS

| | | | |
|---|---|---|---|
| 2003/0109783 A1* | 6/2003 | Heid et al. | 600/421 |
| 2003/0184298 A1* | 10/2003 | Heid et al. | 324/318 |
| 2004/0239327 A1* | 12/2004 | Heid et al. | 324/318 |
| 2005/0073311 A1* | 4/2005 | Nistler et al. | 324/318 |
| 2005/0073312 A1* | 4/2005 | Heid | 324/322 |
| 2005/0099180 A1* | 5/2005 | Nistler et al. | 324/318 |

FOREIGN PATENT DOCUMENTS

| | | |
|---|---|---|
| DE | 38 11 983 A1 | 10/1989 |
| DE | 44 14 371 A1 | 7/1995 |
| DE | 101 56 770 A1 | 7/2002 |
| GB | 2153080 A * | 8/1985 |

* cited by examiner

GENERATOR FOR GENERATING TIME-VARIABLE MAGNETIC FIELDS AND MAGNETIC RESONANCE DEVICE

CROSS REFERENCE TO RELATED APPLICATIONS

This application claims priority to the German application No. 10345766.6, filed Oct. 1, 2003 and which is incorporated by reference herein in its entirety.

FIELD OF INVENTION

The invention relates to a generator of time-variable magnetic fields in a magnetic resonance device and a magnetic resonance device with said generator.

BACKGROUND OF INVENTION

Magnetic resonance technology is a known technology for, for example, obtaining images of the inside of a subject under examination. In this process rapidly switched gradient fields generated by a gradient coil system are superimposed on a static base magnetic field generated by a base field magnet in a magnetic resonance device. The magnetic resonance device also has a high-frequency antenna, which radiates high-frequency signals into the subject under examination to trigger magnetic resonance signals and picks up the triggered magnetic resonance signals, which are used as a basis for creating magnetic resonance images.

SUMMARY OF INVENTION

From DE 38 11 983 A1 it is known for example that a high-frequency antenna of a magnetic resonance device can be connected via a coaxial cable to a high-frequency transmitter and receiver unit in the magnetic resonance device. A specially configured sheath wave filter is thereby inserted into the coaxial cable.

A magnetic resonance device is known from DE 44 14 371 A1, with which a high-frequency screen is arranged between a high-frequency antenna and a gradient coil system of the magnetic resonance device, said screen being configured such that it allows transmission of the electromagnetic fields in the low-frequency range generated by the gradient coil system and does not allow transmission of the fields in the high-frequency range generated by the high-frequency antenna. The high-frequency screen thereby comprises a first and a second electrically conductive layer arrangement, the second being arranged opposite the first, separated from each other by a dielectric, whereby the layer arrangements comprise adjacent printed conductors, which are separated from each other by electrically insulating slots, the slots in the first layer arrangement are arranged in an offset manner in relation to those in the second and adjacent printed conductors in at least one layer arrangement are connected to each other by means of specially arranged bridges conducting high-frequency currents and comprising capacitors for example.

Finally a magnetic resonance device with a gradient coil system is known from DE 101 56 770 A1, with which an electrically conductive structure is arranged and configured such that a magnetic field of the structure produced by a gradient field by means of induction effects is similar to the gradient field at least within the imaging volume of the magnetic resonance device. In one embodiment at least part of the structure is thereby configured as a component of a base field magnet in the form of a drum-shaped sheath. This means for example that the gradient coil system can advantageously be configured without gradient screen coils, as the per se undesirable consequences of the switched gradient fields can be almost totally controlled by preliminary distortion due to the similarity of the magnetic field produced by the structure, so that the gradient fields are not attenuated due to gradient screen coils.

One object of the invention is to create a generator of time-variable magnetic fields in a magnetic resonance device, with which a high-frequency antenna of the generator can be connected in a compact manner.

This object is achieved by the claims. Advantageous embodiments are described in the dependent claims.

The fact that the high-frequency antenna is fed or guided through the gradient coil ensures a compact overall structure of the generator, so that for a high level of patient comfort for example the generator can be configured with a comparatively large internal diameter compared with comparable conventional solutions with the same external diameter.

BRIEF DESCRIPTION OF THE DRAWINGS

Further advantages, features and details of the invention will emerge from the exemplary embodiments of the invention described below with reference to the Figures, in which.

DETAILED DESCRIPTION OF INVENTION

Figure 1:
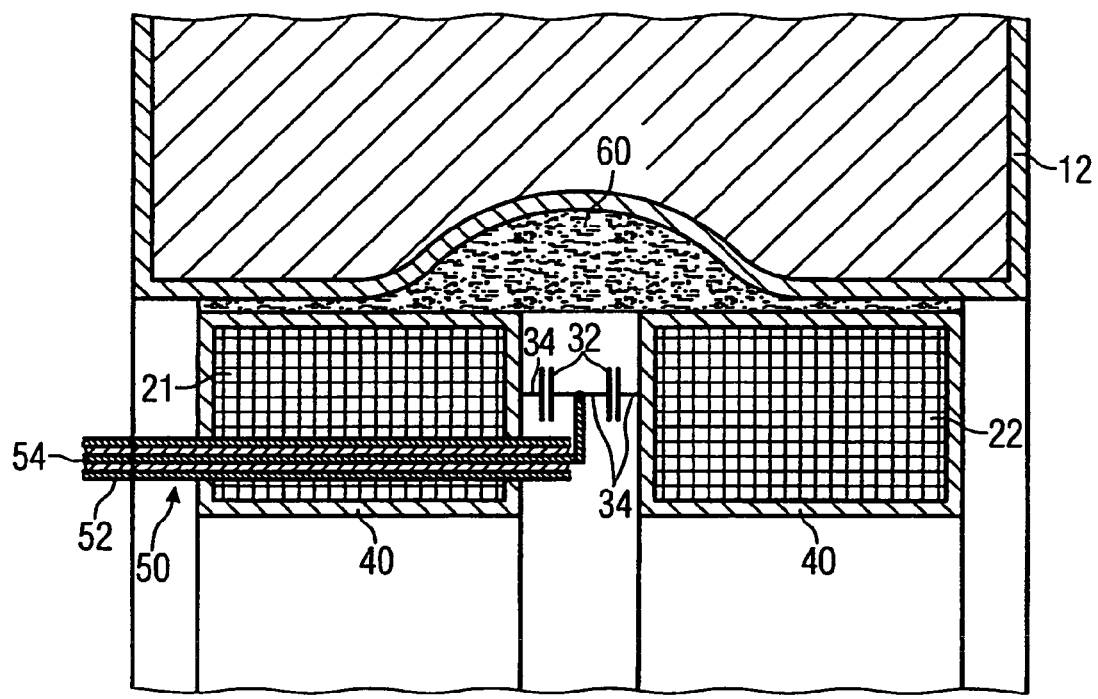
FIG. 1 shows a longitudinal section through the upper half of a magnetic resonance device with a tunnel-type patient chamber, with a base field magnet with a hollow section widening to form a drum-shaped sheath, with a gradient coil system enclosed by a high-frequency screen and with a coaxial connecting cable for a high frequency antenna penetrating the gradient coil system in the axial direction.

FIG. 1 shows an exemplary embodiment of the invention in the form of a longitudinal section through the upper half of a magnetic resonance device with a tunnel-type patient chamber. To generate the most homogenous possible static base magnetic field in the patient chamber, the magnetic resonance device has a superconducting base field magnet essentially in the form of a hollow cylinder, whereby an electrically conductive vacuum container 12 of the base field magnet is widened to form a drum-shaped sheath in the region of the hollow section to adapt the concept of the above-mentioned DE 101 56 770 A1. In the hollow section of the base field magnet a generator of time-variable magnetic fields is arranged comprising a non-actively screened gradient coil system and a high-frequency antenna. The generator is thereby connected to the base field magnet in that an intermediate space between the two elements is filled with a mass 60, which has a low level of dielectric high-frequency loss and which reinforces the overall arrangement to reduce mechanical vibration and oscillation, thereby counteracting the development of noise during operation of the magnetic resonance device.

The gradient coil system comprises two separate units 21 and 22 in the shape of hollow cylinders, which comprise a first and a second transverse gradient coil and a longitudinal gradient coil for generating rapidly switchable gradient fields. Each of the two units 21 and 22 is thereby essentially enveloped by a high-frequency screen 40. Between the high-frequency screens 40 of the two units 21 and 22 parts of a high-frequency antenna are arranged, which comprise antenna rods 34 and resonance capacitors 32 for example to configure a low-pass birdcage high-frequency antenna. Part of the high-frequency screen 40 thereby also forms part of the current paths of the high-frequency antenna, for which purpose the said parts of the high-frequency antenna are connected in a high-frequency conductive manner to the high-frequency screen 40.

For connection to a high-frequency transmitter and receiver unit of the magnetic resonance device the high-frequency antenna is connected to a coaxial connecting cable 50. The connecting cable 50 thereby penetrates the unit 21 in an axial direction. At the points at which the connecting cable 50 punctures the high-frequency screen 40, a screen 52 of the coaxial connecting cable 50 is connected conductively to the high-frequency screen 40. The central conductor 54 of the coaxial connecting cable 50 is thereby guided between the capacitors 32 of the high-frequency antenna and connected to it there. For reasons of clarity the coaxial connecting cable 50 is shown extra large and the capacitors 32 of the high-frequency antenna are only shown as circuit symbols.

Due to the spatial proximity of the gradient coil system and therefore the high-frequency screen 40 to the vacuum container 11 and its associated capacitive coupling, the high-frequency screen 40 is at ground potential as regards high frequency, which allows connection of the screen 52 of the coaxial connecting cable 50 to the high-frequency screen 40 and for example obviates the need to insert special wave trap sheaths into the screen 52. In other embodiments the high-frequency screen 40 can also be connected in an electrically conductive manner to the vacuum container 12 by means of several short-circuit strips arranged in a distributed manner in the circumferential direction, which short-circuit strips may or may not be provided with series capacitors to compensate for their inherent conductivity. In the case of an embodiment of the high-frequency antenna as a circular polarity antenna, two such coaxial connecting cables 50 should be passed through one or both of the units 21 and 22 in the manner shown.

Figure 2:
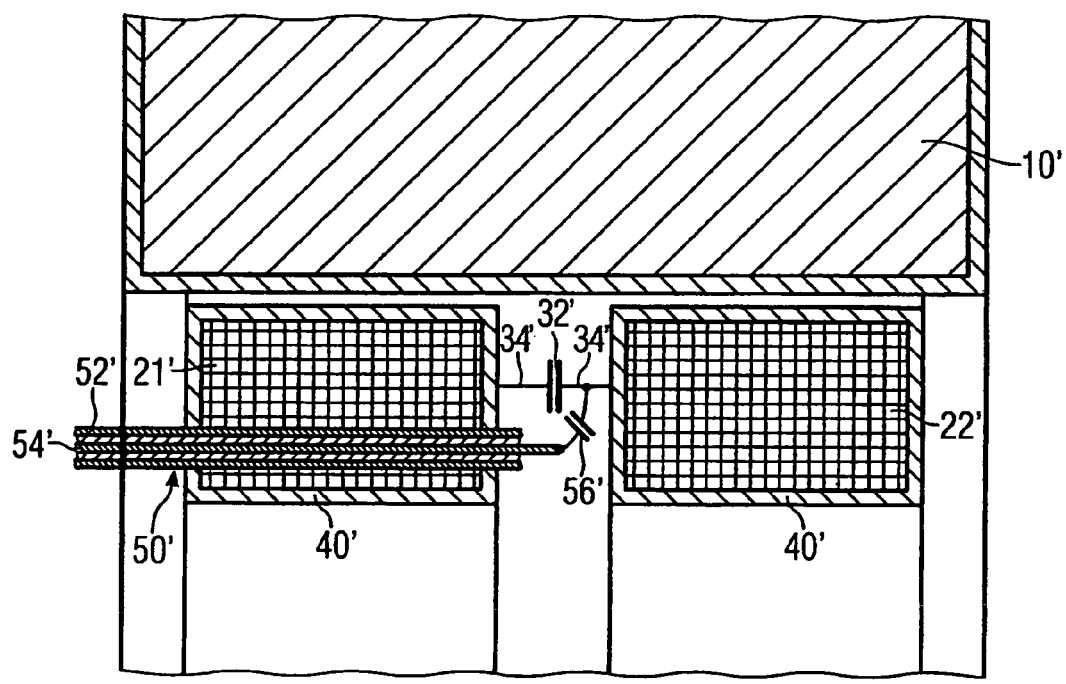
FIG. 2 shows a longitudinal section through the upper half of a magnetic resonance device with a tunnel-type patient chamber, with a base field magnet with a cylindrical hollow section, with a gradient coil system enclosed by a high-frequency screen and with a coaxial connecting cable for a high-frequency antenna penetrating the gradient coil system in the axial direction.

FIG. 2 shows an exemplary embodiment of the invention in the form of a longitudinal section through the upper half of a magnetic resonance device with a tunnel-type patient chamber. To generate the most homogenous possible static base magnet field in the patient chamber, the magnetic resonance device has a superconducting base field magnet 10' essentially in the form of a hollow cylinder. In the cylindrical hollow section of the base field magnet 10' a generator of time-variable magnetic fields is arranged comprising a non-actively screened gradient coil system and a high-frequency antenna.

The gradient coil system comprises two separate units 21' and 22' in the shape of hollow cylinders. Each of the two units 21' and 22' is thereby essentially enveloped by a high-frequency screen 40'. Between the high-frequency screens 40' of the two units 21' and 22' parts of a high-frequency antenna are arranged, which comprise antenna rods 34' and resonance capacitors 32' for example to configure a low-pass birdcage high-frequency antenna.

For connection to a high-frequency transmitter and receiver unit of the magnetic resonance device the high-frequency antenna is connected to a coaxial connecting cable 50'. The connecting cable 50' thereby penetrates the unit 21' in the axial direction. At the points at which the connecting cable 50' punctures the high-frequency screen 40, a screen 52' of the coaxial connecting cable 50' is connected conductively to the high-frequency screen 40'. The central conductor 54' of the coaxial connecting cable 50' is thereby guided via a matching capacitor 56' to the high-frequency antenna and connected to it there. For reasons of clarity the coaxial connecting cable 50' is shown extra-large and the capacitors 32' and 56' are only shown as circuit symbols. Otherwise the description relating to FIG. 1 applies correspondingly to FIG. 2.

The above description also applies correspondingly to actively screened gradient coil systems and/or also to generators of time-variable fields, with which the gradient coil system does not break down completely into two structurally separate halves.

For a detailed description of the advantages of a gradient coil system comprising two units 21 and 22 or 21' and 22' with a high-frequency antenna arranged in between compared with conventional solutions and the distribution of gradient coil conductors to the two units 21 and 22 or 21' and 22', see also the post-published DE 103 13 229 of the applicant.

The invention claimed is:

1. A generator configured for generating time-variable magnetic fields, in a magnetic resonance device comprising:
   a gradient coil having conductors extending in an area defined by a hollow first cylinder, and having no conductors in a central area of the hollow first cylinder, the central area defined by the volume of a second cylinder arranged coaxially with and inside the first cylinder, the second cylinder having a diameter of one third the diameter of the first cylinder;
   a high frequency shielding device enclosing the central area but not the conductors;
   a high frequency antenna arranged in the central area; and
   a coaxial connecting cable operatively connected to the high frequency antenna arranged along a longitudinal axis of the first and second cylinder, the connecting cable penetrating the high frequency shielding device at a plurality of locations.

2. The generator according to claim 1, wherein a shield of the coaxial connecting cable is connected to the high frequency shielding device at the plurality of locations, the connection providing a short circuit for high frequencies.

3. The generator according to claim 1, wherein a central conductor of the coaxial connecting cable is connected to the high frequency antenna between two capacitors of the high frequency antenna.

4. The generator according claim 1, wherein a central conductor of the coaxial connecting cable is connected to the high-frequency antenna using a matching capacitor.

5. The generator according to claim 1, wherein the high frequency antenna is connected to the high frequency shielding device, the connection providing a short circuit for high frequencies.

6. The generator according claim 1, wherein the high frequency antenna is a birdcage antenna.

7. The generator according to claim 1, wherein the central area comprises an area formed substantially as a hollow cylinder.

8. The generator according to claim 7, wherein the high frequency antenna extends within the hollow cylinder.

9. The generator according claim 1, further comprising a gradient coil system having the gradient coil, the gradient coil system having a first and a second structurally separate unit, wherein the high frequency antenna is arranged between the first and second units.

10. The generator according to claim 1, wherein the first and second units are separately enclosed by the high frequency shielding device.

11. A magnetic resonance device, comprising
a generator configured for generating time-variable magnetic fields, the generator comprising:
a gradient coil having conductors extending in an area defined by a hollow first cylinder, and having no conductors in a central area of the hollow first cylinder, the central area defined by the volume of a second cylinder arranged coaxially with and inside the first cylinder, the second cylinder having a diameter of one third the diameter of the first cylinder;
a high frequency shielding device enclosing the central area but not the conductors;
a high frequency antenna arranged in the central area; and
a coaxial connecting cable operatively connected to the high frequency antenna arranged along a longitudinal axis of the first and second cylinder, the connecting cable penetrating the high frequency shielding device at a plurality of locations.

12. The magnetic resonance device according to claim 11, further comprising a base field magnet having a hollow section, the generator arranged in the hollow section.

13. The magnetic resonance device according to claim 12, wherein the base field magnet is a superconducting base field magnet having a vacuum container, the vacuum container forming the hollow section.

14. The magnetic resonance device according to claim 12, further comprising
an electrically conductive element at least partially enclosing the generator, the element generating an eddy current field triggered by a current change in the gradient coil, wherein at least a portion of the eddy current field has a compensating effect within an imaging volume of the magnetic resonance device with respect to at least a non-linear part of a gradient field generated by the gradient coil.

15. The magnetic resonance device according to claim 14, wherein the eddy current field within the imaging volume is similar in shape to the gradient field.

16. The magnetic resonance device according to claim 14, wherein the eddy current field within the imaging volume is similar in size to the gradient field.

17. The magnetic resonance device according to claim 14, wherein the eddy current field within the imaging volume is similar in intensity to the gradient field.

18. The magnetic resonance device according to claim 14, wherein at least a part of the electrically conductive element is formed by at least a portion of the base field magnet.

19. The magnetic resonance device according to claim 16, wherein the base field magnet is a superconducting base field magnet having a vacuum container, the vacuum container forming the electrically conductive element.

20. The magnetic resonance device according to claim 14, wherein the electrically conductive element is formed essentially as a drum-shaped sheath.

* * * * *